United States Patent
Kim et al.

(10) Patent No.: US 10,734,043 B2
(45) Date of Patent: Aug. 4, 2020

(54) MEMORY SYSTEM FOR ADJUSTING CLOCK FREQUENCY

(71) Applicant: SAMSUNG ELECTRONICS CO., LTD., Suwon-si, Gyeonggi-Do (KR)

(72) Inventors: Young-Ju Kim, Hwaseong-si (KR); Dong-Seok Kang, Suwon-si (KR); Hye Jung Kwon, Seoul (KR); Byungchul Kim, Suwon-si (KR); Seungjun Bae, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 49 days.

(21) Appl. No.: 16/054,633

(22) Filed: Aug. 3, 2018

(65) Prior Publication Data

US 2019/0180797 A1  Jun. 13, 2019

(30) Foreign Application Priority Data

Dec. 11, 2017  (KR) .................. 10-2017-0169122

(51) Int. Cl.
| | |
|---|---|
| *G11C 8/00* | (2006.01) |
| *G11C 7/10* | (2006.01) |
| *H03L 7/08* | (2006.01) |
| *G11C 8/18* | (2006.01) |
| *G11C 11/408* | (2006.01) |

(Continued)

(52) U.S. Cl.
CPC ............ *G11C 7/1093* (2013.01); *G11C 7/02* (2013.01); *G11C 7/1066* (2013.01); *G11C 7/1072* (2013.01); *G11C 7/222* (2013.01); *G11C 8/18* (2013.01); *G11C 11/4076* (2013.01); *G11C 11/4087* (2013.01); *G11C 11/4096* (2013.01); *G11C 29/023* (2013.01); *G11C 29/028* (2013.01); *H03L 7/08* (2013.01); *G06F 13/1689* (2013.01); *G06F 13/4234* (2013.01);

(Continued)

(58) Field of Classification Search
CPC ..... G11C 7/1093; G11C 7/1066; G11C 7/222; G11C 8/18; G11C 11/4076; G11C 11/4087
USPC ........................................ 365/193, 233.1, 233
See application file for complete search history.

(56) References Cited

U.S. PATENT DOCUMENTS

| 6,335,901 B1 | 1/2002 | Morita et al. |
| 7,609,095 B2 | 10/2009 | Grand et al. |

(Continued)

FOREIGN PATENT DOCUMENTS

| JP | H10283250 | 10/1998 |
| JP | 2007310549 | 11/2007 |
| JP | 4592281 | 12/2010 |

*Primary Examiner* — Connie C Yoha
(74) *Attorney, Agent, or Firm* — F. Chau & Associates, LLC

(57) ABSTRACT

A memory system includes a logic circuit and a phase locked loop (PLL) circuit. The logic circuit determines a first frequency of a first clock using a first signal and generates a second signal for adjusting the first frequency of the first clock. The PLL circuit receives a second clock, and generates the first clock having the first frequency determined by the logic circuit, using the second clock and the second signal. When a second frequency of the second clock varies, the logic circuit determines the first frequency of the first clock such that the first frequency of the first clock generated by the PLL circuit is uniform, and operates based on the first clock having the first frequency adjusted by the second signal.

19 Claims, 7 Drawing Sheets

(51) Int. Cl.

| | | |
|---|---|---|
| *G11C 11/4096* | (2006.01) | |
| *G11C 11/4076* | (2006.01) | |
| *G11C 29/02* | (2006.01) | |
| *G11C 7/22* | (2006.01) | |
| *G11C 7/02* | (2006.01) | |
| G06F 13/42 | (2006.01) | |
| G11C 11/4093 | (2006.01) | |
| G06F 13/16 | (2006.01) | |

(52) U.S. Cl.
 CPC ........ *G11C 11/4093* (2013.01); *G11C 29/022* (2013.01); *G11C 2207/2254* (2013.01)

(56) References Cited

U.S. PATENT DOCUMENTS

| | | |
|---|---|---|
| 9,343,126 B2 | 5/2016 | Baliga et al. |
| 10,054,635 B2 * | 8/2018 | Lillestolen ................ H03L 7/16 |
| 10,218,360 B2 * | 2/2019 | Patil ...................... H03L 7/0814 |
| 2007/0070793 A1 | 3/2007 | Do |
| 2007/0101177 A1* | 5/2007 | Kuroki ..................... G06F 1/06 713/500 |
| 2017/0004869 A1 | 1/2017 | Shin et al. |

\* cited by examiner

MEMORY SYSTEM FOR ADJUSTING CLOCK FREQUENCY

CROSS-REFERENCE TO RELATED APPLICATION

This application claims priority under 35 U.S.C. § 119 to Korean Patent Application No. 10-2017-0169122, filed on Dec. 11, 2017, in the Korean Intellectual Property Office, the disclosure of which is incorporated by reference herein in its entirety.

TECHNICAL FIELD

Exemplary embodiments of the inventive concept disclosed herein relate to a memory system, and more particularly, relate to a memory system for adjusting a frequency of a clock.

DISCUSSION OF RELATED ART

As information devices such as computers, mobile phones, and smartphones develop, a large amount of information is being stored in and processed by the information devices. Accordingly, a memory device having higher performance may be required as a component of an information device. Since a semiconductor memory operates with low power, it may be used in a memory device. The semiconductor memory may include a random access memory (RAM), a read only memory (ROM), or the like. RAM may include a static RAM (SRAM), a dynamic RAM (DRAM), or the like.

An information processing device such as a central processing unit (CPU) or an application processor (AP) may exchange various signals with memory devices, based on a clock. To process information, the information processing device outputs a command and data to a memory device, based on the clock. The memory device may receive the command and data from the information processing device, based on the clock.

The clock may include noise caused by various factors. When the clock includes noise, the information processing device may not operate normally.

SUMMARY

According to an exemplary embodiment of the inventive concept, a memory system may include a logic circuit and a phase locked loop (PLL) circuit. The logic circuit may determine a first frequency of a first clock using a first signal and may generate a second signal for adjusting the first frequency of the first clock. The PLL circuit may receive a second clock, and may generate the first clock having the first frequency determined by the logic circuit, using the second clock and the second signal. When a second frequency of the second clock varies, the logic circuit may determine the first frequency of the first clock such that the first frequency of the first clock generated by the PLL circuit is uniform, and may operate based on the first clock having the first frequency adjusted by the second signal.

According to an exemplary embodiment of the inventive concept, a memory system may include a logic circuit, a phase locked loop (PLL) circuit, and a memory cell array. The logic circuit may determine a first frequency of a first clock using a first signal, and may generate a second signal for adjusting the first frequency of the first clock and a third signal associated with a data signal. The PLL circuit may generate the first clock using a second clock and the second signal. The memory cell array may store an identifier and may output the data signal indicating the identifier using the third signal. When a frequency of the data signal varies, the logic circuit may determine the first frequency of the first clock such that a ratio between the first frequency of the first clock and the frequency of the data signal is uniform. The first frequency of the first clock determined by the logic circuit may be one of frequencies determined based on the identifier.

According to an exemplary embodiment of the inventive concept, a memory system may include a logic circuit, a phase locked loop (PLL) circuit, and a memory cell array. The logic circuit may generate a second signal for adjusting a first frequency of a first clock, using a first signal. The PLL circuit may include a divider having a division ratio adjusted according to the second signal, and may generate the first clock having the first frequency obtained from a second clock using the division ratio. The memory cell array may output a data signal indicating an identifier. The first frequency may be one of frequencies determined based on the identifier.

BRIEF DESCRIPTION OF THE FIGURES

The above and other objects and features of the inventive concept will become apparent by describing in detail exemplary embodiments thereof with reference to the accompanying drawings.

DETAILED DESCRIPTION OF THE EMBODIMENTS

Figure 1:
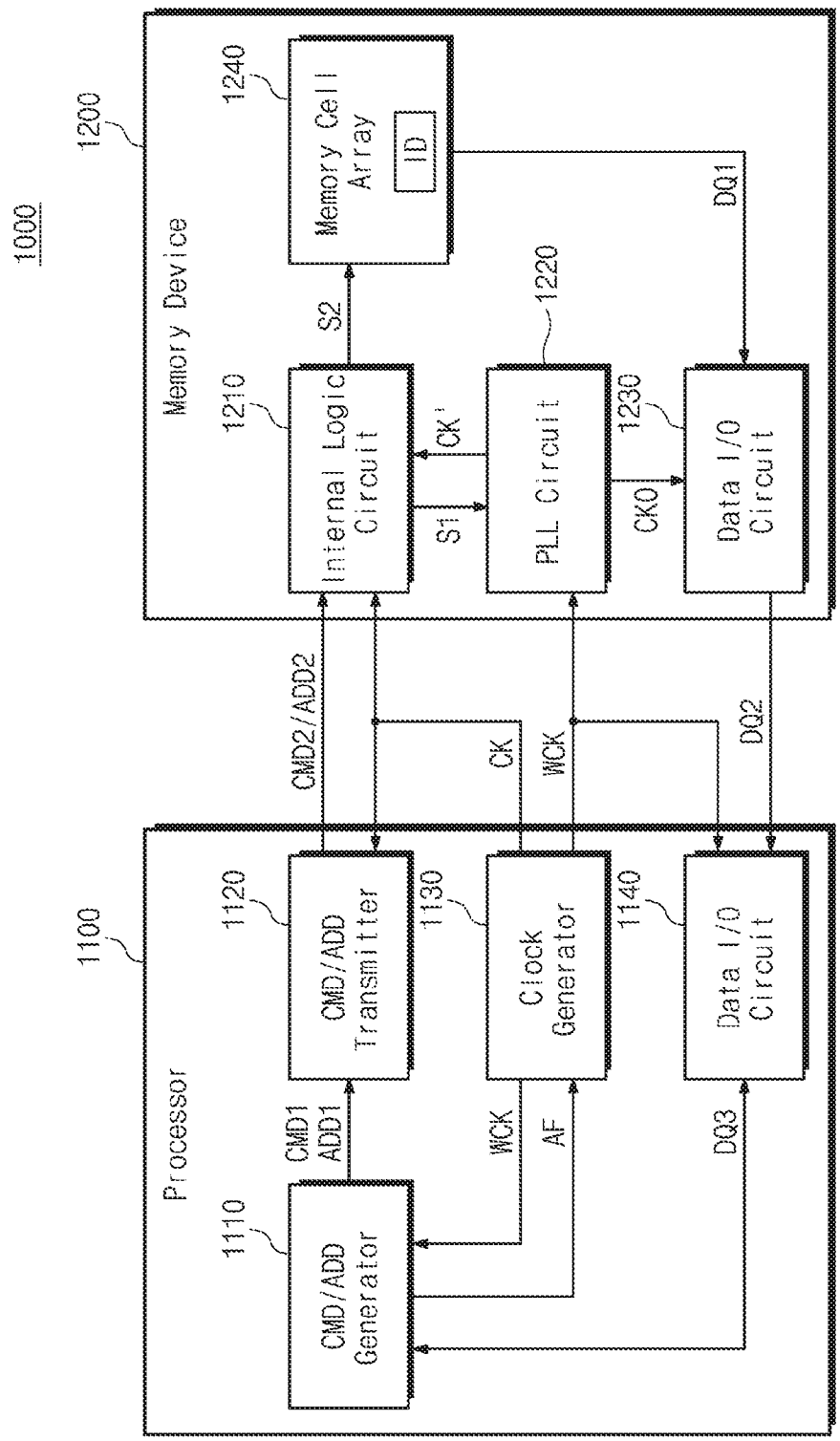
FIG. 1 is a block diagram illustrating a memory system according to an exemplary embodiment of the inventive concept.

Exemplary embodiments of the inventive concept provide a memory system for adjusting a frequency of a clock for the purpose of operating normally by using a varying clock.

Below, exemplary embodiments of the inventive concept will be described in detail with reference to the accompanying drawings. Like reference numerals may refer to like elements throughout this application.

FIG. 1 is a block diagram illustrating a memory system according to an exemplary embodiment of the inventive concept. Referring to FIG. 1, a memory system 1000 may include a processor 1100 and a memory device 1200. The processor 1100 may include a command/address (CMD/ADD) generator 1110, a CMD/ADD transmitter 1120, a clock generator 1130, and a data input/output circuit 1140. The memory device 1200 may include an internal logic circuit 1210, a phase locked loop (PLL) circuit 1220, a data input/output circuit 1230, and a memory cell array 1240.

The processor 1100 may be one of a general-purpose processor, a workstation processor, an application processor (AP), or the like. Alternatively, the processor 1100 may be a memory controller for controlling the memory device 1200. The memory device 1200 may include a volatile memory such as a static random access memory (SRAM), a dynamic RAM (DRAM), or a synchronous DRAM (SDRAM), and/or a nonvolatile memory such as a flash memory, a phase-change RAM (PRAM), a magneto-resistive RAM (MRAM), a resistive RAM (ReRAM), or a ferro-electric RAM (FRAM). The processor 1100 and the memory device 1200 may be included within an electronic device such as a personal computer (PC), a workstation, a laptop, a mobile device, or the like.

The CMD/ADD generator 1110 may generate an address signal ADD1 for controlling the memory cell array 1240. The address signal ADD1 may indicate an address corresponding to a specific memory cell in the memory cell array 1240. For example, the address signal ADD1 may indicate an address corresponding to a location of an identifier ID stored in the memory cell array 1240. The CMD/ADD generator 1110 may output the address signal ADD1 to the CMD/ADD transmitter 1120. The identifier ID may include data associated with the memory device 1200.

For example, the identifier ID may refer to an operation mode of the memory device 1200. For example, the CMD/ADD generator 1110 may obtain information about the operation mode of the memory device 1200 from the identifier ID. The CMD/ADD generator 1110 may obtain information associated with a ratio between a frequency of a clock WCK and a frequency of a data signal DQ2, from the operation mode of the memory device 1200. In other words, the identifier ID may indicate information associated with the ratio between the frequency of the clock WCK and the frequency of the data signal DQ2. The identifier ID will be described in detail below. An operation mode will be described in detail with reference to an operation of the memory device 1200.

The CMD/ADD generator 1110 may receive the clock WCK from the clock generator 1130. The CMD/ADD generator 1110 may determine a new frequency (hereinafter referred to as an "adjustment frequency") of the clock WCK, based on the clock WCK. The CMD/ADD generator 1110 may generate a signal AF associated with the newly determined adjustment frequency.

The CMD/ADD generator 1110 may output the signal AF to the clock generator 1130. An exemplary adjustment frequency determined by the CMD/ADD generator 1110 will be described below.

The CMD/ADD generator 1110 may newly determine a frequency of the data signal DQ2 to be output from the data input/output circuit 1230. For example, the CMD/ADD generator 1110 may determine a frequency of the data signal DQ2 by using a value set in advance. The CMD/ADD generator 1110 may newly determine a frequency of the data signal DQ2 in response to a request of a host. When a request is not received from the host, the CMD/ADD generator 1110 may maintain an existing frequency of the data signal DQ2. An exemplary frequency of the data signal DQ2 determined according to the host request will be described below.

The CMD/ADD generator 1110 may generate a command signal CMD1 for controlling operations of the PLL circuit 1220 and the memory cell array 1240. The command signal CMD1 may indicate information associated with the adjustment frequency and information about a frequency of the data signal DQ2. The CMD/ADD generator 1110 may output the command signal CMD1 to the CMD/ADD transmitter 1120.

The CMD/ADD transmitter 1120 may receive the address signal ADD1 and the command signal CMD1 from the CMD/ADD generator 1110. The CMD/ADD transmitter 1120 may receive the clock CK from the clock generator 1130. The CMD/ADD transmitter 1120 may generate an address signal ADD2 and a command signal CMD2 respectively corresponding to the address signal ADD1 and the command signal CMD1. The CMD/ADD transmitter 1120 may output the address signal ADD2 and the command signal CMD2 to the internal logic circuit 1210, based on the clock CK. For example, the CMD/ADD transmitter 1120 may include electronic circuits, such as one or more buffers, for outputting the address signal ADD2 and the command signal CMD2.

The clock generator 1130 may generate the clock CK and the clock WCK. The clock generator 1130 may receive the signal AF from the CMD/ADD generator 1110. The clock generator 1130 may adjust a frequency of the clock WCK, based on the signal AF. The clock generator 1130 may adjust a frequency of the clock WCK and output the clock WCK with the adjusted frequency. Then, the clock WCK may have the adjustment frequency. The clock generator 1130 may output the clock CK to the CMD/ADD transmitter 1120, and the internal logic circuit 1210. The clock generator 1130 may output the clock WCK to the CMD/ADD generator 1110, the data input/output circuit 1140, and the PLL circuit 1220. Components operating based on the clock CK and components operating based on the clock WCK will be described below.

The data input/output circuit 1140 may receive the clock WCK from the clock generator 1130. The data input/output circuit 1140 may receive the data signal DQ2 from the data input/output circuit 1230. The data input/output circuit 1140 may output a data signal DQ3 to the CMD/ADD generator 1110, based on the clock WCK. For example, the data input/output circuit 1140 may include electronic circuits such as one or more buffers for the purpose of outputting the data signal DQ3 and receiving the data signal DQ2.

The memory device 1200 may operate in a specific operation mode. The operation mode may correspond to a ratio between a frequency of the data signal DQ2 and a frequency of the clock WCK. For example, operation modes may include a double data rate (DDR) mode, a quad data rate (QDR) mode, or the like. When the memory device 1200 operates in the DDR mode, a frequency of the data signal DQ2 and a frequency of the clock WCK may be substantially identical to each other (a ratio of 1:1). When the memory device 1200 operates in the QDR mode, the frequency of the data signal DQ2 may be about two times the frequency of the clock WCK (a ratio of 1:2).

Since a period corresponds to a frequency, the operation mode may be associated with a ratio between a period of the data signal DQ2 and a period of the clock WCK. As will be described with reference to FIGS. 3 to 5, the data signal DQ2 may indicate data having a specific number of bits every period of the data signal DQ2. The period of the data signal DQ2 may be associated with the number of bits of data indicated by the data signal DQ2. Accordingly, the operation mode may be associated with the number of bits of data indicated by the data signal DQ2 during the period of the clock WCK.

For example, when the memory device 1200 operates in the DDR mode, the memory device 1200 may output the data signal DQ2 indicating 1-bit data during the period of the clock WCK. For example, when the memory device 1200 operates in the QDR mode, the memory device 1200 may output the data signal DQ2 indicating 2-bit data during the period of the clock WCK.

The internal logic circuit 1210 may receive the clock CK from the clock generator 1130. The internal logic circuit 1210 may receive a clock CK' from the PLL circuit 1220. The internal logic circuit 1210 may determine whether a frequency of the clock CK and a frequency of the clock CK' are substantially identical to each other. For example, when a difference between the frequency of the clock CK and the frequency of the clock CK' is not greater than a reference value, the internal logic circuit 1210 may determine that the frequency of the clock CK and the frequency of the clock CK' are substantially identical to each other. When the difference between the frequency of the clock CK and the frequency of the clock CK' is greater than or equal to the reference value, the internal logic circuit 1210 may determine that the frequency of the clock CK and the frequency of the clock CK' are different.

When it is determined by the internal logic circuit 1210 that the frequency of the clock CK and the frequency of the clock CK' are different, the internal logic circuit 1210 may adjust the frequency of the clock CK' to allow the clock CK' to have substantially the same frequency as the frequency of the clock CK. The internal logic circuit 1210 may generate a signal S1 for adjusting the frequency of the clock CK'. The internal logic circuit 1210 may output the signal S1 to the PLL circuit 1220.

The internal logic circuit 1210 may receive the address signal ADD2 and the command signal CMD2 from the CMD/ADD transmitter 1120, based on the clock CK'. The internal logic circuit 1210 may generate the signal S1 for controlling an operation of the PLL circuit 1220, based on the command signal CMD2.

The internal logic circuit 1210 may newly determine a frequency of a clock CKO to be output from the PLL circuit 1220, based on the command signal CMD2. The internal logic circuit 1210 may newly determine the frequency of the clock CKO, based on the frequency of the data signal DQ2. The frequency of the clock CKO newly determined by the internal logic circuit 1210 may be about ¼ times the frequency of the data signal DQ2. The signal S1 may indicate information associated with the newly determined frequency of the clock CKO.

For example, the internal logic circuit 1210 may control a power state of the PLL circuit 1220, based on the newly determined frequency of the clock CKO and the adjustment frequency. For example, when the frequency of the clock CKO and the adjustment frequency are substantially identical to each other, the internal logic circuit 1210 may turn off the PLL circuit 1220 by using the signal S1. For example, when the frequency of the clock CKO and the adjustment frequency are different, the internal logic circuit 1210 may turn on the PLL circuit 1220 by using the signal S1. An exemplary method for turning on or turning off the PLL circuit 1220 will be described with reference to an operation of the PLL circuit 1220.

As described above, the internal logic circuit 1210 may adjust the frequencies of the clock CK' and the clock CKO, and generate the signal S1 for controlling the power state of the PLL circuit 1220.

The internal logic circuit 1210 may generate a signal S2 for controlling an operation of the memory cell array 1240, based on the address signal ADD2 and the command signal CMD2. For example, the signal S2 may indicate an address of the identifier ID stored in the memory cell array 1240. For example, the internal logic circuit 1210 may adjust the frequency of the data signal DQ1, based on the signal S2. As described with reference to the operation of the data input/output circuit 1230, the frequency of the data signal DQ2 may be substantially identical to the frequency of the data signal DQ1. Accordingly, the internal logic circuit 1210 may adjust the frequency of the data signal DQ2 by using the signal S2.

The internal logic circuit 1210 may receive the clock CK' from the PLL circuit 1220. The internal logic circuit 1210 may output the signal S1 to the PLL circuit 1220. The internal logic circuit 1210 may output the signal S2 to the memory cell array 1240, based on the clock CK'.

The PLL circuit 1220 may receive the signal S1 from the internal logic circuit 1210. The PLL circuit 1220 may receive the clock WCK from the clock generator 1130. The PLL circuit 1220 may generate the clock CK' having substantially the same frequency as the frequency of the clock CK, based on the signal S1 and the clock WCK. The PLL circuit 1220 may output the clock CK' to the internal logic circuit 1210.

The PLL circuit 1220 may be turned on or turned off in response to the signal S1. For example, the PLL circuit 1220 may include one or more transistors. The transistors may be supplied with a voltage through a switch from a power generator or the like. The internal logic circuit 1210 may control a connection of the switch by outputting the signal S1. When the switch is connected, the PLL circuit 1220 may be turned on. When the switch is disconnected, the PLL circuit 1220 may be turned off.

When the PLL circuit 1220 is turned off, the PLL circuit 1220 may pass the received clock WCK to output the clock CKO that is substantially the same as the clock WCK. When the PLL circuit 1220 is turned on, the PLL circuit 1220 may generate the clock CKO having a frequency newly determined by the internal logic circuit 1210, in response to the signal S1. Detailed configuration and operation of the PLL circuit 1220 will be described with reference to FIG. 2.

However, the PLL circuit 1220 may generate and output the clock CK' regardless of the power state of the PLL circuit 1220. Accordingly, even though the PLL circuit 1220 is turned off by the signal S1, the PLL circuit 1220 may generate and output the clock CK'.

The memory cell array 1240 may receive the signal S2 from the internal logic circuit 1210. The memory cell array 1240 may store data. For example, according to a designer, the memory cell array 1240 may store the identifier ID in cells of a specific address. The memory cell array 1240 may input and output a data signal indicating specific data. For example, the memory cell array 1240 may output the data signal DQ1 indicating the identifier ID.

The memory cell array 1240 may include a row decoder and a column decoder for the purpose of outputting the data signal DQ1. The row decoder and the column decoder may supply voltages to memory cells corresponding to the specific address, based on the signal S2. As the voltages are supplied to the memory cells, the data signal DQ1 indicating stored data may be generated. For example, the data signal DQ1 indicating the identifier ID may be generated.

The memory cell array 1240 may generate the data signal DQ1, which indicates the identifier ID and has a frequency newly determined by the CMD/ADD generator 1110, based on the signal S2 received from the internal logic circuit 1210. The memory cell array 1240 may output the data signal DQ1 to the data input/output circuit 1230.

The data input/output circuit 1230 may receive the clock CKO from the PLL circuit 1220. The data input/output circuit 1230 may input and output a data signal based on the clock CKO. The data input/output circuit 1230 may receive the data signal DQ1 from the memory cell array 1240, based on the clock CKO. The data input/output circuit 1230 may output the data signal DQ2 to the data input/output circuit 1140, based on the clock CKO. For example, the data input/output circuit 1230 may include electronic circuits, such as one or more buffers, for the purpose of outputting the data signal DQ2. Since the data signal DQ2 is generated based on the data signal DQ1, the frequency of the data signal DQ2 may be substantially identical to the frequency of the data signal DQ1. Additionally, data indicated by the data signal DQ2 may be substantially identical to data indicated by the data signal DQ1. For example, the data signal DQ2 may indicate the identifier ID.

The data input/output circuit 1230 may operate normally based on the clock CKO having a frequency of a specific ratio to a frequency of the data signal DQ2. The specific ratio may be set in advance by the designer.

The data input/output circuit 1230 may operate based on the clock CKO having a frequency corresponding to ¼ of the frequency of the data signal DQ2 (e.g., the clock CKO corresponding to the case where a ratio of a frequency of the data signal DQ2 and a frequency of the clock CKO is 4:1). However, the inventive concept is not limited thereto. For example, the data input/output circuit 1230 may operate normally based on the clock CKO having a frequency of any ratio to the frequency of the data signal DQ2.

As described above, the memory device 1200 may output the data signal DQ2 to the processor 1100, based on the clock WCK.

Below, a difference between components operating based on the clock CK or the clock CK' having substantially the same frequency as the frequency of the clock CK and components operating based on the clock WCK will be described.

As described with reference to FIG. 1, the processor 1100 and the memory device 1200 may exchange a command signal and an address signal with each other. For example, the processor 1100 may output the command signal CMD2 and the address signal ADD2 to the memory device 1200. Alternatively, the processor 1100 and the memory device 1200 may exchange data signals with each other. For example, the memory device 1200 may output the data signal DQ2 to the processor 1100.

By the memory system 1000, the data signals DQ1 to DQ3 may be processed more quickly than the command signals CMD1 and CMD2 and the address signals ADD1 and ADD2. Accordingly, a frequency of a clock used to process the data signals DQ1 to DQ3 may be higher than a frequency of a clock used to process the command signals CMD1 and CMD2 and the address signals ADD1 and ADD2. The frequency of the clock WCK may be higher than the frequency of the clock CK and the clock CK'. Accordingly, the command signal CMD1, the address signal ADD1, the command signal CMD2, and the address signal ADD2 may be generated, output, and received based on the clock CK or the clock CK'.

As described with reference to the operation of the PLL circuit 1220, the clock CKO may be generated based on the clock WCK. The frequency of the clock WCK and the clock CKO may be higher than the frequency of the clock CK and the clock CK'. Accordingly, the data signal DQ1 and the data signal DQ2 may be generated, output, and received based on the clock CKO. The data signal DQ3 may be generated, output, and received based on the clock WCK.

Below, an exemplary method where the memory system 1000 generates the clock CKO using the PLL circuit 1220 will be described.

1. Obtaining Information Associated with Available Operation Modes of Memory Device 1200

The identifier ID may include various information associated with the memory device 1200. For example, the identifier ID may indicate information about available operation modes of the memory device 1200. The memory device 1200 may be designed by the designer to support specific operation modes (e.g., available operation modes). For example, when the memory device 1200 supports the DDR mode and the QDR mode, the identifier ID may include information indicating that the available operation modes of the memory device 1200 include the DDR mode and the QDR mode.

Each of the available operation modes may correspond to a specific ratio between the adjustment frequency and the frequency of the data signal DQ2. For example, in the DDR mode, a ratio between the adjustment frequency and the frequency of the data signal DQ2 may be 1:1. For example, in the QDR mode, a ratio between the adjustment frequency and the frequency of the data signal DQ2 may be 1:2. An available operation mode will be more fully described with reference to FIG. 2.

The CMD/ADD generator 1110 may generate the address signal ADD1 for obtaining the identifier ID. For example, the identifier ID may be stored in specific memory cells of the memory cell array 1240. The address signal ADD1 may indicate an address corresponding to memory cells in which the identifier ID is stored. The CMD/ADD generator 1110 may output the address signal ADD1 to the CMD/ADD transmitter 1120. The CMD/ADD transmitter 1120 may output the address signal ADD2 corresponding to the address signal ADD1 to the internal logic circuit 1210.

The internal logic circuit 1210 may output the signal S2 for controlling the memory cell array 1240, based on the address signal ADD2. The memory cell array 1240 may output the data signal DQ1 indicating the identifier ID to the data input/output circuit 1230, based on the signal S2. The data input/output circuit 1230 may output the data signal DQ2 indicating the identifier ID to the data input/output circuit 1140, based on the data signal DQ1. The data input/output circuit 1140 may output the data signal DQ3 indicating the identifier ID to the CMD/ADD generator 1110, based on the data signal DQ2.

The CMD/ADD generator 1110 may obtain the identifier ID of the memory device 1200, based on the data signal DQ3. The CMD/ADD generator 1110 may obtain information about the available operation modes of the memory device 1200 from the identifier ID.

2. Adjustment of Frequency of Clock WCK and Frequency of Data Signal DQ2

(1) Case where Frequency of Clock WCK is Adjusted

The clock WCK may include noise in the process where the clock generator 1130 generates the clock WCK. For example, the clock WCK may include a jitter. The jitter may be associated with a difference value between a frequency of a reference clock and a frequency of an actual clock. For example, the clock generator 1130 may receive a reference clock. The clock generator 1130 may compare a frequency of the reference clock and a frequency of the clock WCK to measure the jitter of the clock WCK. When the clock WCK does not include the jitter, the clock WCK may be output with substantially the same period and frequency as the reference clock.

When the clock WCK includes the jitter, the frequency of the clock WCK may be different from the frequency of the reference clock. The memory device 1200 may operate based on the clock WCK. Accordingly, when the jitter included in the clock WCK is not smaller than a reference value, the memory device 1200 may not operate normally. As the frequency of the clock WCK decreases, the operation of the memory device 1200 may be less affected by the jitter included in the clock WCK. Accordingly, the CMD/ADD generator 1110 may determine the adjustment frequency depending on the jitter included in the clock WCK.

However, one of frequencies determined based on the identifier ID may be determined as the adjustment frequency. For example, the CMD/ADD generator 1110 may determine the adjustment frequency based on the information about the available operation modes obtained from the identifier ID. For example, when the frequency of the data signal DQ2 determined by the CMD/ADD generator 1110 is "2f" and the available operation modes include the DDR mode and the QDR mode, the CMD/ADD generator 1110 may determine "2f" corresponding to the DDR mode or "f" corresponding to the QDR mode as the adjustment frequency. The CMD/ADD generator 1110 may not determine frequencies that do not correspond to the available operation modes as the adjustment frequency.

When the jitter of the clock WCK is not smaller than the reference value, the CMD/ADD generator 1110 may determine the adjustment frequency for adjusting the frequency of the clock WCK. For example, to allow operations of the memory device 1200 to be less affected by the jitter, the CMD/ADD generator 1110 may set the adjustment frequency to a value lower than a frequency of the clock WCK before the adjustment frequency is determined. Since the frequency of the clock WCK before the adjustment frequency is determined is different from the newly determined adjustment frequency, the CMD/ADD generator 1110 may generate the signal AF for adjusting the frequency of the clock WCK.

When the jitter of the clock WCK is smaller than or equal to the reference value, the CMD/ADD generator 1110 may set the adjustment frequency as substantially the same value as the frequency of the clock WCK before the adjustment frequency is determined. Since the frequency of the clock WCK before the adjustment frequency is determined is substantially identical to the newly determined adjustment frequency, the CMD/ADD generator 1110 may not generate the signal AF.

According to the method described above, the CMD/ADD generator 1110 may determine a new frequency of the clock WCK based on the noise (e.g., the jitter) included in the clock WCK. The CMD/ADD generator 1110 may generate the command signal CMD1 indicating information about the adjustment frequency and information about the frequency of the data signal DQ2.

(2) Case where Frequency of Data Signal DQ2 is Adjusted

In response to a request of a host or the like, the processor 1100 may process data at a speed higher than a reference speed. Alternatively, in response to the request of the host or the like, the processor 1100 may process data at a speed lower than the reference speed. Accordingly, the CMD/ADD generator 1110 may adjust the frequency of the data signal DQ2 in response to the host request. For example, the CMD/ADD generator 1110 may increase the frequency of the data signal DQ2. Alternatively, the CMD/ADD generator 1110 may decrease the frequency of the data signal DQ2.

However, one of frequencies determined based on the identifier ID may be determined as the frequency of the data signal DQ2. The CMD/ADD generator 1110 may determine the frequency of the data signal DQ2 based on the information about the available operation modes obtained from the identifier ID. Each of the available operation modes may correspond to a specific ratio between the adjustment frequency and the frequency of the data signal DQ2. For example, a ratio between the adjustment frequency corresponding to the DDR mode and the frequency of the data signal DQ2 may be 1:1. For example, a ratio between the adjustment frequency corresponding to the QDR mode and the frequency of the data signal DQ2 may be 1:2.

For example, when the adjustment frequency determined by the CMD/ADD generator 1110 is "f" and the available operation modes include the DDR mode and the QDR mode, the CMD/ADD generator 1110 may determine "f" corresponding to the DDR mode or "2f" corresponding to the QDR mode as a new frequency of the data signal DQ2. The CMD/ADD generator 1110 may not determine frequencies that do not correspond to the available operation modes as the frequency of the data signal DQ2.

The CMD/ADD generator 1110 may generate the command signal CMD1 associated with the adjustment frequency and the new frequency of the data signal DQ2.

3. Output of Signals from CMD/ADD Generator 1110

The CMD/ADD generator 1110 may output the signal AF indicating the adjustment frequency to the clock generator 1130. The CMD/ADD generator 1110 may output, to the CMD/ADD transmitter 1120, the command signal CMD1 indicating information about the adjustment frequency and information about the frequency of the data signal DQ2. The CMD/ADD transmitter 1120 may output the command signal CMD2 corresponding to the command signal CMD1 to the internal logic circuit 1210.

4. Frequency of Clock CKO for Operating Data Input/Output Circuit 1230 Normally

As described with reference to the operation of the data input/output circuit 1230, the data input/output circuit 1230 may operate normally based on the clock CKO of a specific frequency. The frequency of the clock CKO for operating the data input/output circuit 1230 normally may be determined according to a ratio between the frequency of the clock CKO and the frequency of the data signal DQ2. For example, the data input/output circuit 1230 may operate normally when a ratio between the frequency of the data signal DQ2 and the frequency of the clock CKO is 4:1.

The internal logic circuit 1210 may determine the frequency of the clock CKO for a normal operation of the data input/output circuit 1230. The internal logic circuit 1210 may control the PLL circuit 1220 such that the PLL circuit 1220 generates the clock CKO having the determined frequency. Accordingly, as described above, even though the frequency of the clock WCK varies or the frequency of the data signal DQ2 varies, a ratio between the frequency of the clock CKO and the frequency of the data signal DQ2 may be maintained. Accordingly, even though the frequency of the clock WCK varies or the frequency of the data signal DQ2 varies, the data input/output circuit 1230 may operate normally. Below, an exemplary method where the internal logic circuit 1210 controls the PLL circuit 1220 will be described in detail.

5. Control of PLL Circuit 1220 by Internal Logic Circuit 1210

The internal logic circuit 1210 may receive the command signal CMD2 from the CMD/ADD transmitter 1120. The internal logic circuit 1210 may generate the signal S1 for controlling the PLL circuit 1220, based on the command signal CMD2. For example, the internal logic circuit 1210 may control a power state of the PLL circuit 1220. The internal logic circuit 1210 may adjust the frequency of the clock CKO.

For example, the internal logic circuit 1210 may adjust a division ratio of the PLL circuit 1220 for the purpose of adjusting the frequency of the clock CKO. The internal logic circuit 1210 may output the signal S1 to a divider included in the PLL circuit 1220. The divider and the division ratio will be more fully described with reference to FIG. 2.

As described with reference to the operation of the PLL circuit 1220, the PLL circuit 1220 may generate the clock CKO having a frequency newly determined by the internal logic circuit 1210. The PLL circuit 1220 may output the clock CKO to the data input/output circuit 1230.

Figure 2:
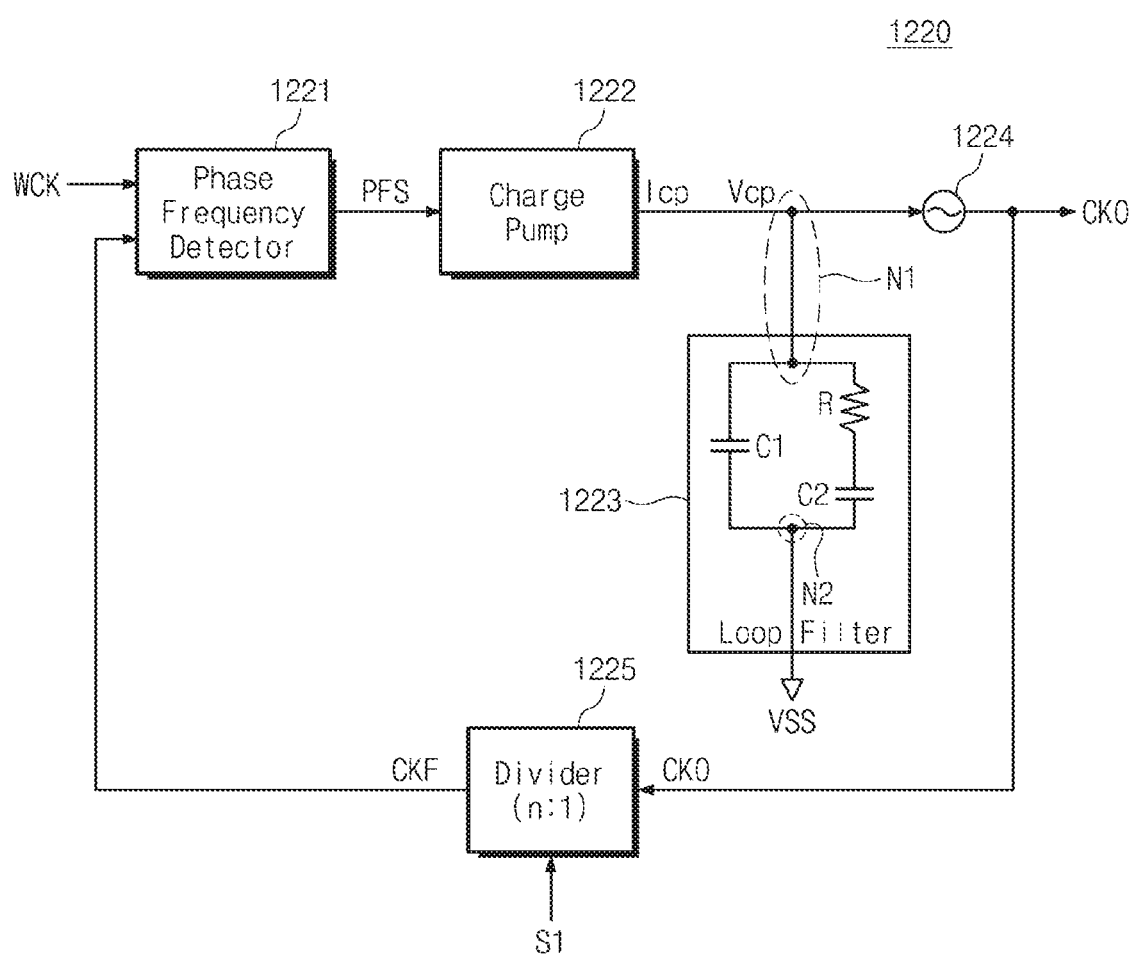
FIG. 2 is a block diagram illustrating a detailed configuration of a phase locked loop circuit of FIG. 1 according to an exemplary embodiment of the inventive concept.

FIG. 2 is a block diagram illustrating a detailed configuration of a PLL circuit of FIG. 1 according to an exemplary embodiment of the inventive concept.

Referring to FIG. 2, the PLL circuit 1220 may include a phase frequency detector 1221, a charge pump 1222, a loop filter 1223, a voltage controlled oscillator 1224, and a divider 1225. The loop filter 1223 may include a first capacitor C1, a second capacitor C2, and a resistor R.

Referring to FIGS. 1 and 2, the phase frequency detector 1221 may receive the clock WCK from the clock generator 1130. The phase frequency detector 1221 may receive a feedback clock CKF from the divider 1225. The phase frequency detector 1221 may detect a difference between a frequency of the clock WCK and a frequency of the feedback clock CKF. The phase frequency detector 1221 may output a signal PFS having a magnitude corresponding to the difference between the frequency of the clock WCK and the frequency of the feedback clock CKF.

The charge pump 1222 may receive the signal PFS from the phase frequency detector 1221. The charge pump 1222 may generate a current Icp having a magnitude corresponding to the difference between the frequency of the clock WCK and the frequency of the feedback clock CKF, based on the signal PFS. For example, when the frequency of the clock WCK is lower than the frequency of the feedback clock CKF, a sign of the current Icp may be "−". When the frequency of the clock WCK is higher than the frequency of the feedback clock CKF, a sign of the current Icp may be "+". When the frequency of the clock WCK and the frequency of the feedback clock CKF are identical to each other, the magnitude of the current Icp may be "0".

In FIG. 2, the sign of the current Icp may mean a direction of the current Icp. When the signal of the current Icp is "+", the current Icp may be output from the charge pump 1222 to a node N1. When the signal of the current Icp is "−", the current Icp may be output from the node N1 to the charge pump 1222.

The loop filter 1223 may be connected between the node N1 and a node N2. The loop filter 1223 may receive a voltage VSS through the node N2. For example, the voltage VSS may be a ground voltage. The first capacitor C1 may be connected between the node N1 and the node N2. The resistor R may be connected between the node N1 and the second capacitor C2. The second capacitor C2 may be connected between the resistor R and the node N2.

The loop filter 1223 may receive a current component included in the current Icp through the node N1. The first and second capacitors C1 and C2 may be charged by the received current component. As the first and second capacitors C1 and C2 are charged, a voltage Vcp may be formed at the node N1. Since the voltage Vcp is formed based on the current Icp, the magnitude of the voltage Vcp may vary with the sign and magnitude of the current Icp. For example, when the sign and magnitude of the current Icp is "+K", the magnitude of the voltage Vcp may increase as much as a value corresponding to "K". When the sign and magnitude of the current Icp is "−K", the magnitude of the voltage Vcp may decrease as much as a value corresponding to "K".

The voltage controlled oscillator 1224 may receive the voltage Vcp. The voltage controlled oscillator 1224 may output the clock CKO having a frequency corresponding to the magnitude of the voltage Vcp. Referring to FIGS. 1 and 2 together, the voltage controlled oscillator 1224 may output the clock CKO to the data input/output circuit 1230. Additionally, the voltage controlled oscillator 1224 may output the clock CKO to the divider 1225.

The divider 1225 may receive the clock CKO from the voltage controlled oscillator 1224. The divider 1225 may generate the feedback clock CKF having a frequency that is n times the frequency of the clock CKO. In other words, a division ratio of the divider 1225 may be "n:1" (n being a positive number). The division ratio may mean a ratio between the frequency of the feedback clock CKF and the frequency of the clock CKO. The divider 1225 may output the feedback clock CKF to the phase frequency detector 1221.

Referring to FIGS. 1 and 2 together, the divider 1225 may receive the signal S1 from the internal logic circuit 1210. As described with reference to FIG. 1, the internal logic circuit 1210 may adjust the division ratio by using the signal S1. Below, an exemplary method where the PLL circuit 1220 outputs the clock CKO having a frequency corresponding to 1/n times the frequency of the clock WCK will be described.

In FIG. 2, the frequency of the clock WCK and the clock CKO may be "f". The frequency of the feedback clock CKF may be "n*f". The phase frequency detector 1221 may output the signal PFS having a magnitude corresponding to a value obtained by subtracting "n*f" from "f". By the charge pump 1222 and the loop filter 1223, the voltage Vcp, which varies as much as the magnitude corresponding to the value obtained by subtracting "n*f" from "f," may be formed at the node N1. For example, when the value obtained by subtracting "n*f" from "f" is positive (e.g., when "n" is smaller than "1"), the magnitude of the voltage Vcp may increase as much as a value corresponding to a difference between "f" and "n*f". For example, when the value obtained by subtracting "n*f" from "f" is negative (e.g., when "n" is greater than "1"), the magnitude of the voltage Vcp may decrease as much as a value corresponding to a difference between "f" and "n*f". Below, the case where "n" is greater than "F" will be described.

The voltage controlled oscillator 1224 may adjust the frequency of the clock CKO, based on the magnitude of the voltage Vcp. Since the value obtained by subtracting "n*f" from "f" is smaller than "0", the magnitude of the voltage Vcp may decrease as much as a value corresponding to a difference between "f" and "n*f". As the magnitude of the voltage Vcp decreases, the frequency of the clock CKO may decrease as much as a value corresponding to the difference between "f" and "n*f". The divider 1225 may output, to the phase frequency detector 1221, the feedback clock CKF having a frequency that is n times the frequency of the clock CKO, based on the clock CKO. The frequency of the feedback clock CKF may decrease as the frequency of the clock CKO decreases.

According to the above-described method, the frequency of the feedback clock CKF having a value of "n*f" may decrease and may converge to "f" that is the frequency of the clock WCK. As the frequency of the feedback clock CKF converges to "f", the frequency of the clock CKO may converge to "f/n". Accordingly, the PLL circuit 1220 may output the clock CKO having a frequency corresponding to 1/n times the frequency of the clock WCK. The frequency of the clock CKO may correspond to the division ratio and the frequency of the clock WCK.

As described with reference to FIG. 1, the internal logic circuit 1210 may adjust the division ratio to "n:1" by outputting the signal S1. When the division ratio varies, the frequency of the clock CKO (e.g., "f/n") may vary. For example, when "n" is increased by the internal logic circuit 1210, the frequency of the clock CKO may decrease. For example, when "n" is decreased by the internal logic circuit 1210, the frequency of the clock CKO may increase.

The divider 1225 may be designed to have one of specific division ratios determined in advance by the designer. For example, the divider 1225 may have a division ratio of "4:1". When the PLL circuit 1220 is turned off, the frequency of the clock CKO may be substantially identical to the frequency of the clock WCK. When the PLL circuit 1220 is turned on, the frequency of the clock CKO may be ¼ times the frequency of the clock WCK.

As described with reference to FIG. 1, by the internal logic circuit 1210, the frequency of the clock CKO may be set to ¼ times the frequency of the data signal DQ2. For example, the frequency of the data signal DQ2 may be "4f". When the frequency of the clock WCK is "f", the internal logic circuit 1210 may turn off the PLL circuit 1220 for the purpose of outputting the clock CKO having a frequency corresponding to ¼ times the frequency of the data signal DQ2 (e.g., for the purpose of outputting the clock CKO having substantially the same frequency "f" as the frequency "f" of the clock WCK). The PLL circuit 1220 may pass the clock WCK to output the clock CKO having substantially the same frequency as the frequency of the clock WCK.

When the frequency of the data signal DQ2 is "4f" and the frequency of the clock WCK is "2f", the internal logic circuit 1210 may turn on the PLL circuit 1220 to generate the clock CKO having a frequency of "f". Accordingly, even though the frequency of the clock WCK varies, the frequency of the clock CKO output from the PLL circuit 1220 may be substantially uniform.

For example, the division ratio may be associated with an available operation mode. The available operation modes may include the DDR mode (e.g., a mode where the frequency of the clock WCK is "f" and a ratio between the frequency of the clock WCK and the frequency of the data signal DQ2 is 1:1) and the QDR mode (e.g., a mode where the frequency of the clock WCK is "2f" and a ratio between the frequency of the clock WCK and the frequency of the data signal DQ2 is 1:2). In this example, the number of available operation modes may be "2". The CMD/ADD generator 1110 may determine one of "f" and "2f" (two frequencies) as the adjustment frequency. To adjust the frequency of the clock WCK that may have two values, the divider 1225 may provide two division ratios.

Accordingly, when the divider 1225 has "m" division ratios, the number of available operation modes of the memory device 1200 may be "m". Additionally, the number of adjustment frequencies that may be determined by the CMD/ADD generator 1110 may be "m".

The number of available operations modes may be substantially identical to the number of frequencies determined based on the identifier ID (e.g., frequencies to be determined as the adjustment frequency by the CMD/ADD generator 1110). Accordingly, the number of division ratios provided by the divider 1225 may be substantially identical to the number of frequencies that may be determined based on identifiers ID.

As described above, the division ratio may correspond to a specific operation mode. The operation mode may correspond to a ratio between the frequency of the clock WCK and the frequency of the data signal DQ2. Accordingly, the division ratio may correspond to the ratio between the frequency of the clock WCK and the frequency of the data signal DQ2.

As in the above-described method, the PLL circuit 1220 may adjust the frequency of the PLL circuit 1220 to "1/n" times and may generate the clock CK' having substantially the same frequency as the frequency of the clock CK of FIG. 1. The PLL circuit 1220 may output the generated clock CK' to the internal logic circuit 1210. As described with reference to FIG. 1, regardless of a power state of the PLL circuit 1220, the PLL circuit 1220 may output the clock CK' generated based on the clock WCK to the internal logic circuit 1210.

Figure 3:
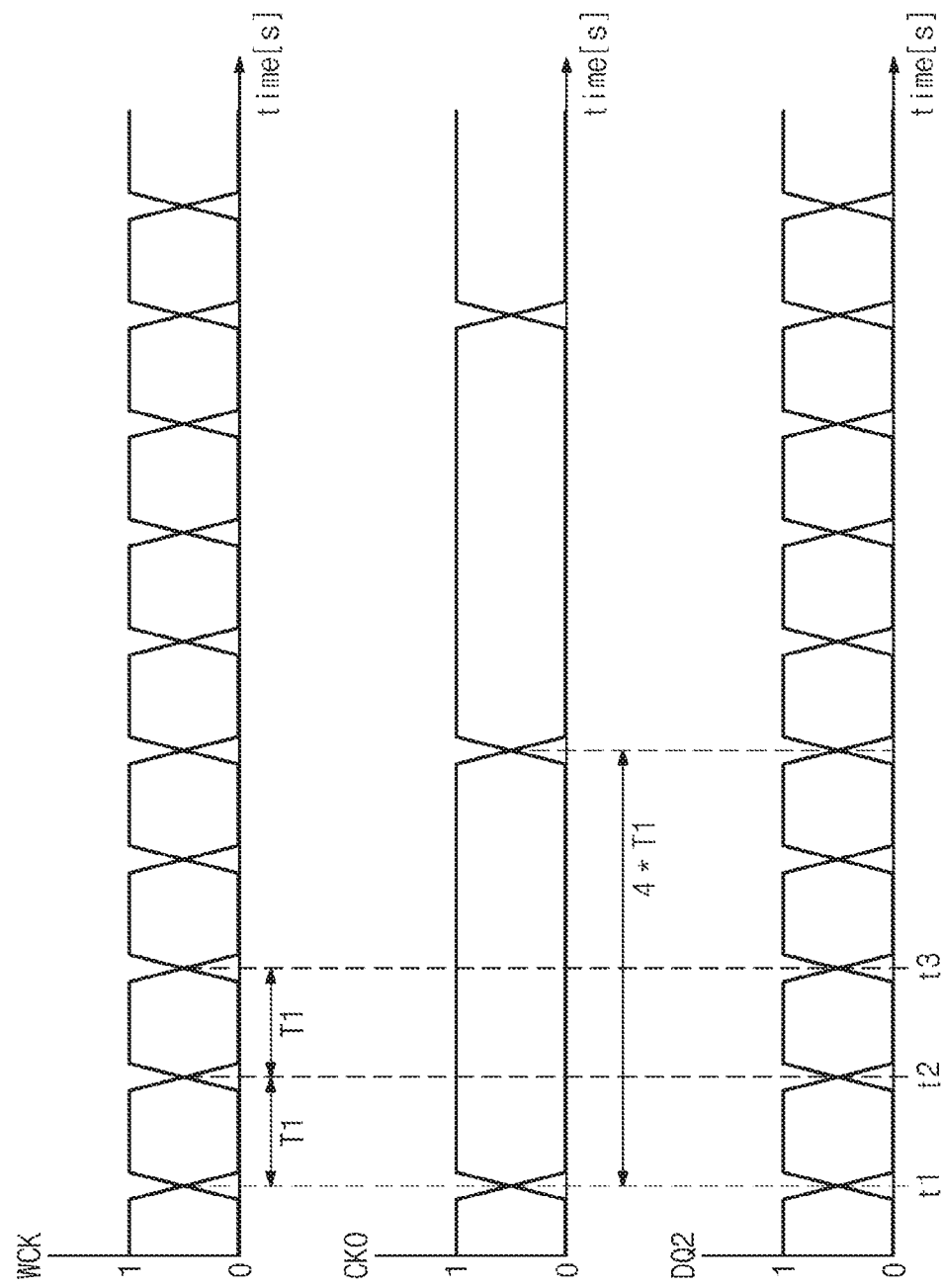
FIG. 3 is a graph illustrating a clock output from a clock generator of FIG. 1 and a data signal output from a data input/output circuit of FIG. 1 according to an exemplary embodiment of the inventive concept.

FIG. 3 is a graph illustrating a clock output from a clock generator of FIG. 1 and a data signal output from a data input/output circuit of FIG. 1 according to an exemplary embodiment of the inventive concept. In FIG. 3, an x-axis represents a time of an [s] unit, and a y-axis represents a logical value.

The clock WCK, the clock CKO, and the data signal DQ2 of FIG. 3 may be the clock WCK, the clock CKO, and the data signal DQ2 of FIG. 1, respectively. In FIG. 3, the clock WCK may have the adjustment frequency newly determined by the CMD/ADD generator 1110. The CMD/ADD generator 1110 may set the adjustment frequency and the frequency of the data signal DQ2 to "1/T1".

Referring to FIG. 3, the period of the clock WCK and the data signal DQ2 may be substantially identical to each other. The period of the clock WCK and the data signal DQ2 may be "T1". In FIG. 3, each of the clock WCK, the clock CKO, and the data signal DQ2 may have one of a logical value of "1" and a logical value of "0" for each period. Below, the case where the data input/output circuit 1230 operates based on the clock CKO having a frequency that is ¼ times the frequency of the data signal DQ2 will be described with reference to FIG. 3. In other words, the PLL circuit 1220 that is configured to generate the clock CKO having a frequency that is ¼ times the frequency of the data signal DQ2 will be described.

A logical value of the clock WCK may vary every period "T1". For example, the clock WCK may have a logical value of "0" between a time point t1 and a time point t2 and may have a logical value of "1" between the time point t2 and a time point t3. The data signal DQ2 may have one logical value every period "T1". For example, the data signal DQ2 may have a logical value of "1" between the time point t1 and the time point t2. Additionally, the data signal DQ2 may have a logical value of "0" between the time point t2 and the time point t3. The logical value of the data signal DQ2 may indicate unit data. For example, the data signal DQ2 may indicate 1-bit data every period "T1"

For example, the data signal DQ2 may indicate 1-bit data every period "T1". Accordingly, the memory device 1200 may output 1-bit data every period "T1" of the clock WCK. In FIG. 3, an operation mode of the memory device 1200 may be the DDR mode.

The frequency of the clock WCK may be about four times the frequency of the clock CKO. Since the adjustment frequency determined by the CMD/ADD generator 1110 and the frequency of the data signal DQ2 are different, the PLL circuit 1220 may be turned on. The PLL circuit 1220 may generate the clock CKO having a frequency that is ¼ times the frequency of the clock WCK (e.g., having a frequency of "1/(4*T1)" and a period of "4*T1"). To this end, the internal logic circuit 1210 may adjust the division ratio to 4:1 by outputting the signal S1. Accordingly, the frequency of the clock CKO may be ¼ times the frequency of the data signal DQ2. Then, the data input/output circuit 1230 may operate normally based on the clock CKO having a frequency that is ¼ times the frequency of the data signal DQ2.

Figure 4:
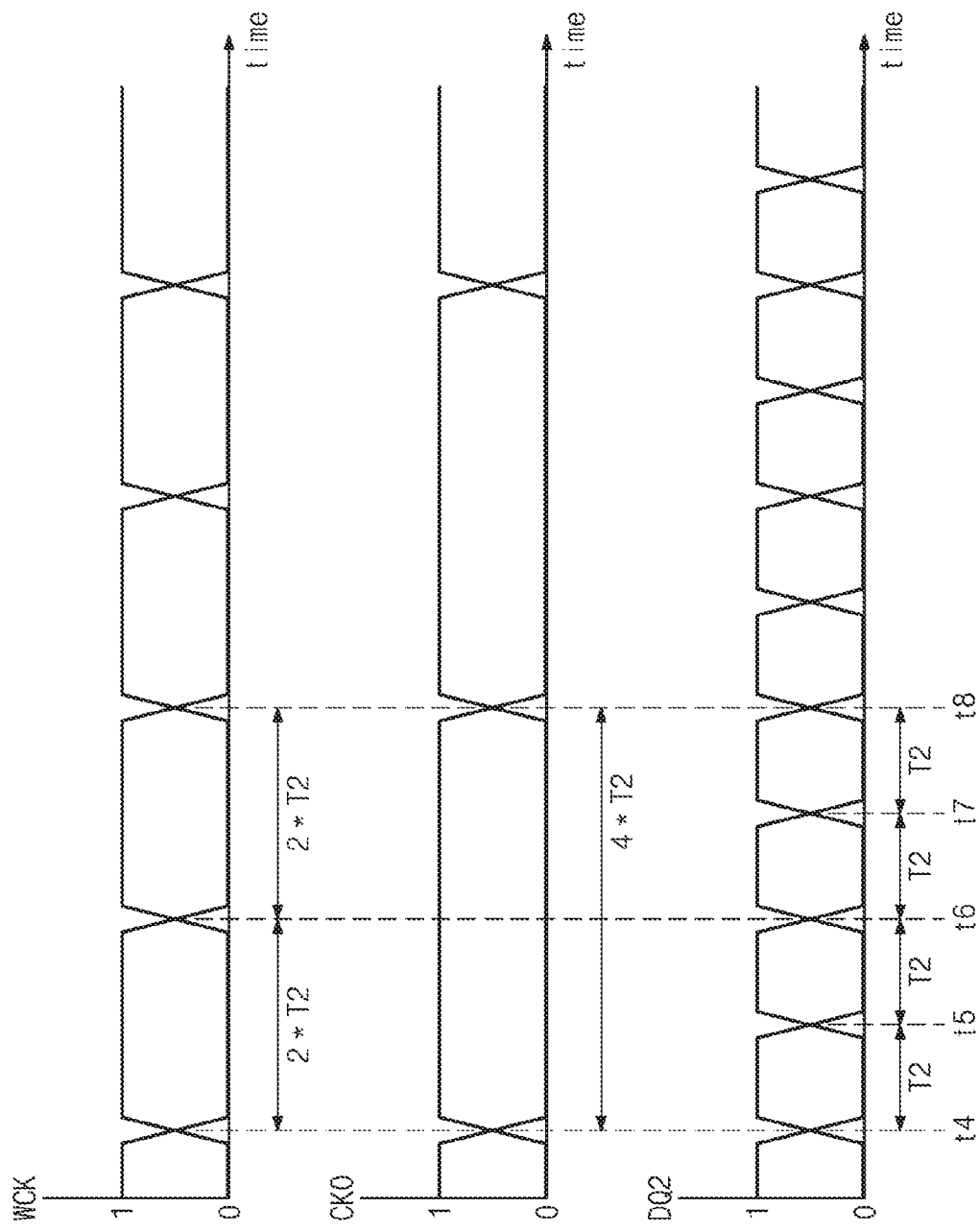
FIG. 4 is a graph illustrating a clock output from the clock generator of FIG. 1 and a data signal output from the data input/output circuit of FIG. 1 according to an exemplary embodiment of the inventive concept.

FIG. 4 is a graph illustrating a clock output from a clock generator of FIG. 1 and a data signal output from a data input/output circuit of FIG. 1 according to an exemplary embodiment of the inventive concept. In FIG. 4, an x-axis represents a time of an [s] unit, and a y-axis represents a logical value.

The clock WCK, the clock CKO, and the data signal DQ2 of FIG. 4 may be the clock WCK, the clock CKO, and the data signal DQ2 of FIG. 1, respectively. In FIG. 4, the clock WCK may have the adjustment frequency newly determined by the CMD/ADD generator 1110.

In FIG. 4, the CMD/ADD generator 1110 may set the adjustment frequency to "1/(2*T2)" and may set the frequency of the data signal DQ2 to "1/T2". Accordingly, the frequency of the data signal DQ2 may be about two times the frequency of the clock WCK. In FIG. 4, each of the clock WCK, the clock CKO, and the data signal DQ2 may have one of a logical value of "1" and a logical value of "0" for each period.

Below, the case where the data input/output circuit 1230 operates based on the clock CKO having a frequency that is ¼ times the frequency of the data signal DQ2 will be described with reference to FIG. 4. In other words, the PLL circuit 1220 that is configured to generate the clock CKO having a frequency that is ¼ times the frequency of the data signal DQ2 will be described.

A logical value of the clock WCK may vary every period "2*T2". For example, the clock WCK may have a logical value of "0" between a time point t4 and a time point t6 and may have a logical value of "1" between the time point t6 and a time point t8. The data signal DQ2 may have one logical value every period "T2". For example, the data signal DQ2 may have a logical value of "1" between the time point t4 and the time point t5 and may have a logical value of "0" between the time point t5 and the time point t6. The data signal DQ2 may have a logical value of "1" between the time point t6 and a time point t7 and may have a logical value of "0" between the time point t7 and a time point t8. Each of the logical values of the data signal DQ2 may indicate unit data. For example, the data signal DQ2 may indicate 1-bit data every period "T2".

The data signal DQ2 may indicate 1-bit data every period "T2". The period "T2" of the data signal DQ2 may be ½ times the period "2*T2" of the clock WCK. Accordingly, the data signal DQ2 may indicate 2-bit data every period "2*T2" of the clock WCK. In FIG. 4, an operation mode of the memory device 1200 may be the QDR mode.

The frequency of the clock WCK may be ½ times the frequency of the data signal DQ2. Since the adjustment frequency determined by the CMD/ADD generator 1110 and the frequency of the data signal DQ2 are different, the PLL circuit 1220 may be turned on. The PLL circuit 1220 may generate the clock CKO having a frequency that is ½ times the frequency of the clock WCK (e.g., having a frequency of "1/(4*T2)" and a period of "4*T2"). To this end, the internal logic circuit 1210 may adjust the division ratio to 2:1 by outputting the signal S1. Accordingly, the frequency of the clock CKO may be ¼ times the frequency of the data signal DQ2. Afterwards, the internal logic circuit 1210 may operate normally based on the clock CKO having a frequency that is ¼ times the frequency of the data signal DQ2.

Referring to FIGS. 3 and 4, "T2" may be substantially identical to "T1". The period of the clock WCK of FIG. 4 may be about two times the period of the clock WCK of FIG. 3. The frequency of the clock WCK of FIG. 3 may be about two times the frequency of the clock WCK of FIG. 4. During the period of the clock WCK, data output in the QDR mode may be about two times data output in the DDR mode.

Figure 5:
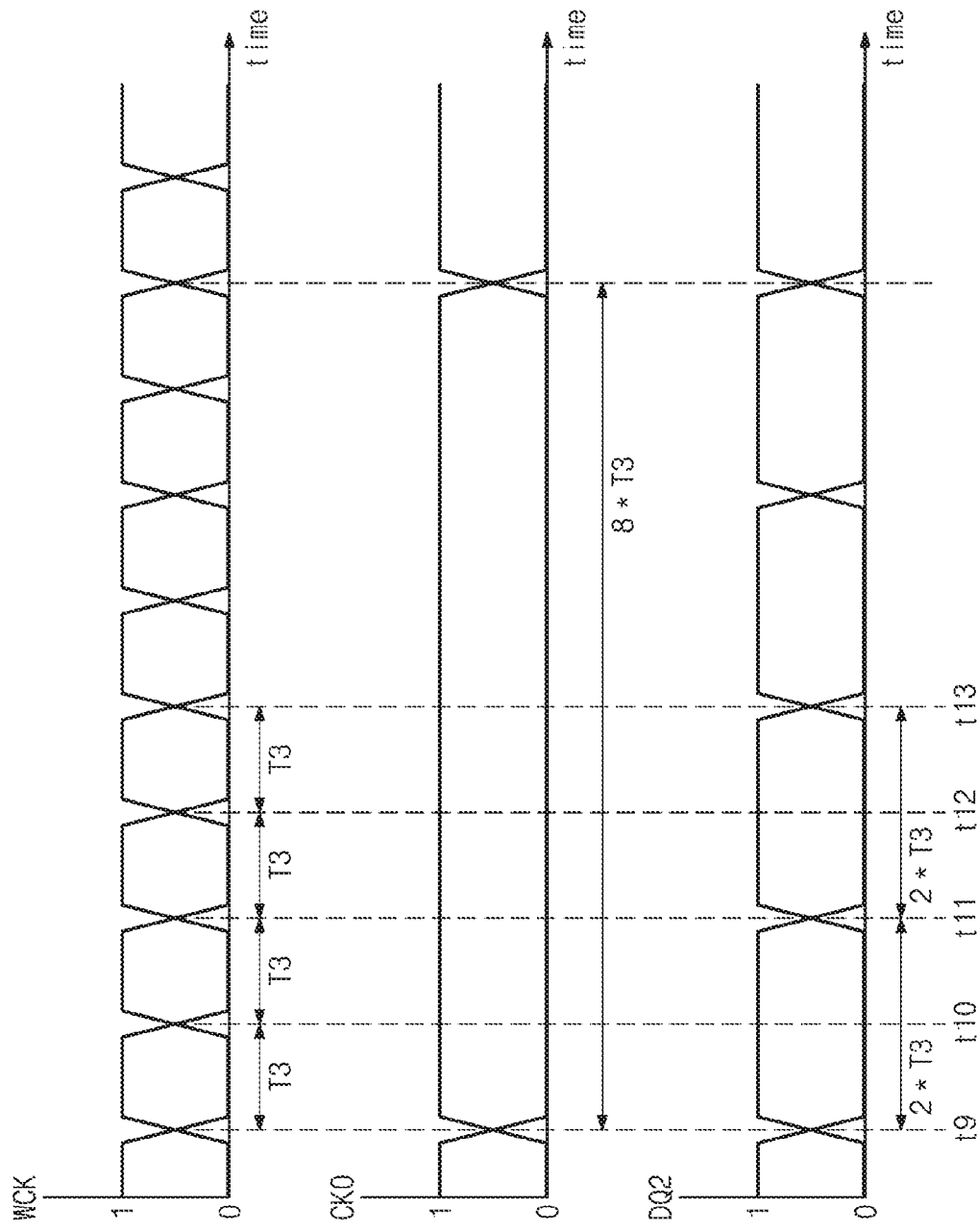
FIG. 5 is a graph illustrating a clock output from the clock generator of FIG. 1 and a data signal output from the data input/output circuit of FIG. 1 according to an exemplary embodiment of the inventive concept.

FIG. 5 is a graph illustrating a clock output from a clock generator of FIG. 1 and a data signal output from a data input/output circuit of FIG. 1 according to an exemplary embodiment of the inventive concept. In FIG. 5, an x-axis represents a time of an [s] unit, and a y-axis represents a logical value.

The clock WCK, the clock CKO, and the data signal DQ2 of FIG. 5 may be the clock WCK, the clock CKO, and the data signal DQ2 of FIG. 1, respectively. In FIG. 5, the clock WCK may have the adjustment frequency newly determined by the CMD/ADD generator 1110. The memory device 1200 may receive the clock WCK from the clock generator 1130. In FIG. 5, the CMD/ADD generator 1110 may set the adjustment frequency to "1/T3" and may set the frequency of the data signal DQ2 to "1/(2*T3)". In FIG. 5, the period "2*T3" of the data signal DQ2 may be two times the period "T3" of the clock WCK. Each of the clock WCK, the clock CKO, and the data signal DQ2 may have one of a logical value of "0" and a logical value of "1" for each period.

Below, the case where the data input/output circuit 1230 operates based on the clock CKO having a frequency that is ¼ times the frequency of the data signal DQ2 will be described with reference to FIG. 5. In other words, the PLL circuit 1220 that is configured to generate the clock CKO having a frequency that is ¼ times the frequency of the data signal DQ2 will be described.

A logical value of the clock WCK may vary every period "T3". For example, the clock WCK may have a logical value of "0" between a time point t9 and a time point t10 and may have a logical value of "1" between the time point t10 and a time point tn. The data signal DQ2 may have one logical value every period "2*T3". For example, the data signal DQ2 may have a logical value of "1" between the time point t9 and the time point t11 and may have a logical value of "0" between the time point t11 and a time point t13. Each of the logical values of the data signal DQ2 may indicate unit data. For example, the data signal DQ2 may indicate 1-bit data every period "2*T3".

The frequency of the clock WCK may be about two times the frequency of the data signal DQ2. Since the adjustment frequency determined by the CMD/ADD generator 1110 and the frequency of the data signal DQ2 are different, the PLL circuit 1220 may be turned on. The PLL circuit 1220 may generate the clock CKO having a frequency that is ⅛ times the frequency of the clock WCK (e.g., having a frequency of "1/(8*T3)" and a period of "8*T3"). To this end, the internal logic circuit 1210 may adjust the division ratio to 8:1 by outputting the signal S1. Accordingly, the frequency of the clock CKO may be ¼ times the frequency of the data signal DQ2. Then, the internal logic circuit 1210 may operate normally based on the clock CKO having a frequency that is ¼ times the frequency of the data signal DQ2.

Referring to FIGS. 3 and 5, "T3" may be substantially identical to "T1". The period "2*T3" of the data signal DQ2 of FIG. 5 may be about two times the period "T1" of the data signal DQ2 of FIG. 3. The period "T3" of the clock WCK of FIG. 5 may be substantially identical to the period "T1" of the clock WCK of FIG. 3. The frequency of the clock WCK of FIG. 3 may be substantially identical to the frequency of the clock WCK of FIG. 5.

Referring to FIGS. 4 and 5, "T3" may be substantially identical to "T2". The period "2*T3" of the data signal DQ2 of FIG. 5 may be about two times the period "T2" of the data signal DQ2 of FIG. 4. The period "T3" of the clock WCK of FIG. 5 may be ½ times the period "2*T2" of the clock WCK of FIG. 4. The frequency of the clock WCK of FIG. 5 may be two times the frequency of the clock WCK of FIG. 4.

Figure 6:
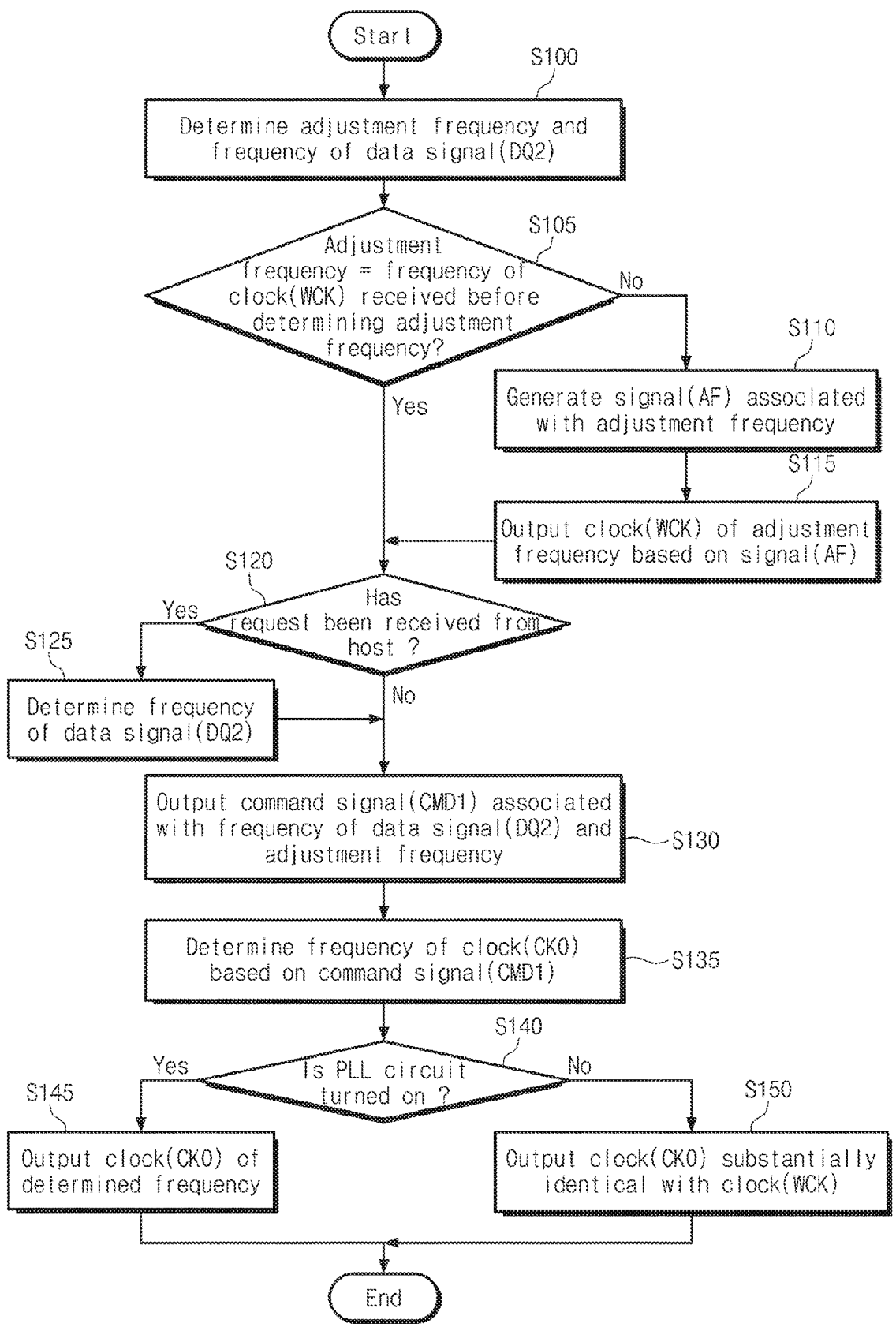
FIG. 6 is a flowchart illustrating a method in which the memory system of FIG. 1 generates a clock according to an exemplary embodiment of the inventive concept.

FIG. 6 is a flowchart illustrating a method in which the memory system of FIG. 1 generates a clock according to an exemplary embodiment of the inventive concept. An exemplary method in which the memory system 1000 generates the clock CKO will be described with reference to FIGS. 1 and 6.

In operation S100, the CMD/ADD generator 1110 may determine the adjustment frequency and the frequency of the data signal DQ2. How the adjustment frequency and the frequency of the data signal DQ2 are determined is described with reference to FIG. 1, and thus, a description thereof will be omitted.

In operation S105, the CMD/ADD generator 1110 may determine whether the adjustment frequency newly determined in operation S100 is identical to a frequency of the clock WCK before the adjustment frequency is determined (e.g., before operation S100 is performed). When the adjustment frequency is identical to the frequency of the clock WCK before the adjustment frequency is determined, operation S120 may be performed. When the adjustment frequency is different from the frequency of the clock WCK before the adjustment frequency is determined, operation S110 may be performed.

In operation S110, the CMD/ADD generator 1110 may generate the signal AF indicating information about the adjustment frequency determined in operation S100.

In operation S115, the clock generator 1130 may output the clock WCK having the newly determined adjustment frequency, based on the signal AF. The clock generator 1130 may output the clock WCK to the CMD/ADD generator 1110, the PLL circuit 1220, and the data input/output circuit 1140.

In operation S120, when the CMD/ADD generator 1110 receives the host request, operation S125 may be performed. When the CMD/ADD generator 1110 does not receive the host request, operation S130 may be performed.

In operation S125, the CMD/ADD generator 1110 may newly determine the frequency of the data signal DQ2, based on the host request received in operation S120.

In FIG. 6, operation S105 to operation S115 are illustrated as being performed prior to operation S120 and operation S125. However, the inventive concept is not limited thereto, and operation S120 to operation S125 and operation S105 to operation S115 may be performed in any order.

In operation S130, the CMD/ADD generator 1110 may output the command signal CMD1 for controlling operations of the PLL circuit 1220 and the memory cell array 1240. The command signal CMD1 may indicate information about the frequency of the data signal DQ2 and the adjustment frequency.

In operation S135, the internal logic circuit 1210 may obtain information about the frequency of the data signal DQ2 and information about the adjustment frequency, based on the command signal CMD1. The internal logic circuit 1210 may newly determine the frequency of the clock CKO, based on the information obtained from the command signal CMD1. For example, the internal logic circuit 1210 may newly determine ¼ times the frequency of the data signal DQ2 as a new frequency of the clock CKO. However, as described above, the inventive concept is not limited thereto, and the frequency of the clock CKO may be set to a frequency of any ratio to the frequency of the data signal DQ2.

In operation S140, the internal logic circuit 1210 may control a power state of the PLL circuit 1220, based on the newly determined frequency of the clock CKO and the adjustment frequency. When the newly determined frequency of the clock CKO is substantially identical to the adjustment frequency, the PLL circuit 1220 may be turned off. When the newly determined frequency of the clock CKO is different from the adjustment frequency, the PLL circuit 1220 may be turned on.

When the PLL circuit 1220 is turned on by the internal logic circuit 1210, operation S145 may be performed. When the PLL circuit 1220 is turned off by the internal logic circuit 1210, operation S150 may be performed.

In operation S145, the PLL circuit 1220 may output the clock CKO having the frequency determined in operation S135.

In operation S150, the PLL circuit 1220 may pass the clock WCK to output the clock CKO that is substantially identical to the clock WCK.

Figure 7:
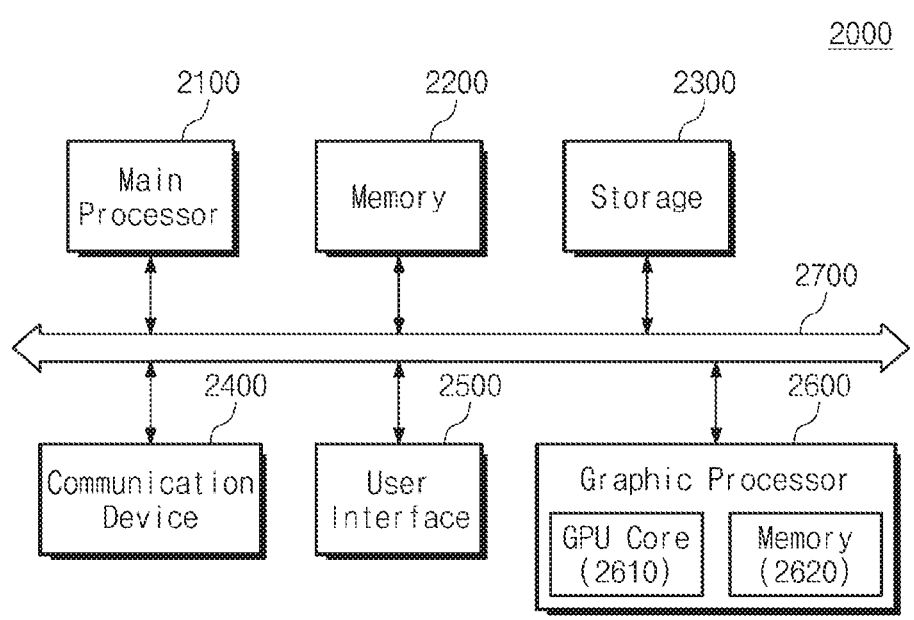
FIG. 7 is a block diagram illustrating an electronic device for implementing the memory system of FIG. 1 according to an exemplary embodiment of the inventive concept.

FIG. 7 is a block diagram illustrating an electronic device for implementing the memory system of FIG. 1 according to an exemplary embodiment of the inventive concept.

For example, an electronic device 2000 may be one of a personal computer (PC), a workstation, a notebook computer, a mobile device, or the like. Referring to FIG. 7, the electronic device 2000 may include a main processor 2100, a memory 2200, storage 2300, a communication device 2400, a user interface 2500, a graphic processor 2600, and a bus 2700. The electronic device 2000 may further include other components (e.g., various sensors, a power supply, or the like). Alternatively, the electronic device 2000 may not include one or more of components that are illustrated in FIG. 7. The electronic device 2000 may include the memory system 1000 of FIG. 1.

The main processor 2100 may control overall operations of the electronic device 2000. The main processor 2100 that is a central control device may process operations needed to operate the electronic device 2000. For example, the main processor 2100 may process data for controlling operations of the electronic device 2000. The main processor 2100 may include the processor 1100 of FIG. 1. For example, the main processor 2100 may be one of a general-purpose processor, a workstation processor, an application processor, or the like. The main processor 2100 may include a single processor core or may include a plurality of processor cores. For example, the main processor 2100 may include a multi-core such as a dual-core, a quad-core, a hexa-core, or the like.

The main processor 2100 may output signals indicating processed data. For example, the main processor 2100 may output the command signal CMD2 and the address signal ADD2 of FIG. 1. The main processor 2100 may receive signals indicating data. For example, the main processor 2100 may receive the data signal DQ2 of FIG. 1. The main processor 2100 may output a clock for an operation of the memory 2200. For example, the main processor 2100 may output the clock WCK and the clock CK of FIG. 1 to the memory 2200. The main processor 2100 may newly determine a frequency of a clock, based on various factors. For example, the main processor 2100 may measure the jitter of the clock WCK of FIG. 1 to adjust the frequency of the clock WCK.

The memory 2200 may store data processed or to be processed by the processor 2100. The memory 2200 may store the identifier ID indicating information associated with the memory 2200. The memory 2200 may include the memory device 1200 of FIG. 1. For example, the memory 2200 may include a volatile memory such as a static random access memory (SRAM), a dynamic RAM (DRAM), a synchronous DRAM (SDRAM), or the like, or a nonvolatile memory such as a flash memory, a phase-change RAM (PRAM), a magneto-resistive RAM (MRAM), a resistive RAM (ReRAM), a ferroelectric RAM (FRAM), or the like. Alternatively, the memory 2200 may include heterogeneous memories.

The memory 2200 may receive a clock from the main processor 2100. For example, the memory 2200 may receive the clock CK and the clock WCK of FIG. 1. The memory 2200 may generate a new clock, based on the clock received clock from the main processor 2100. For example, the memory 2200 may generate the clock CKO of FIG. 1, based on the clock WCK of FIG. 1. The memory 2200 may include electronic circuits for controlling an operation of the memory 2200. For example, the memory 2200 may include the internal logic circuit 1210 of FIG. 1.

The storage 2300 may store data regardless of power supply. For example, the storage 2300 may be a storage medium, which includes a nonvolatile memory, such as a hard disk drive (HDD), a solid state drive (SSD), a secure digital (SD) card, a universal serial bus (USB) memory device, or the like.

The communication device 2400 may include a transmitter unit and a receiver unit. The electronic device 2000 may communicate with another electronic device through the communication device 2400 to transmit and/or receive data.

The user interface 2500 may convey a command or an input/output of data between a user and the electronic device 2000. For example, the user interface 2500 may include a physical device such as an input device and/or an output device. The input device may include a keyboard, a mouse, a touchscreen, a scanner, a joystick, a voice recognition device, a motion recognition device, an eyeball recognition device, or the like, and the output device may include a monitor, a display device, a projector, a speaker, a plotter, or the like.

The graphic processor 2600 may include a GPU core 2610 and a memory 2620. The GPU core 2610 may include the processor 1100 of FIG. 1. The memory 2620 may include the memory device 1200 of FIG. 1

The GPU core 2610 may process data associated with an image. The GPU core 2610 may include one or more cores for the purpose of processing data associated with an image. The GPU core 2610 may process data in parallel by using the one or more cores. The GPU core 2610 may generate a clock for an operation of the graphic processor 2600. For example, the GPU core 2610 may generate the clock CK and the clock WCK of FIG. 1. The GPU core 2610 may adjust a frequency of a clock, based on the generated clock. The GPU core 2610 may control a speed at which the graphic processor 2600 processes data, based on a request of a host or the like.

The memory 2620 may store data processed or to be processed by the GPU core 2610. For example, the memory 2620 may store an identifier indicating information associated with the memory 2620. The memory 2620 may receive a clock from the GPU core 2610. For example, the memory 2620 may receive the clock CK and the clock WCK of FIG. 1. The memory 2620 may generate a new clock, based on the clock received from the GPU core 2610. For example, the memory 2620 may generate the clock CKO of FIG. 1, based on the clock WCK of FIG. 1. The memory 2620 may include electronic circuits for controlling an operation of the memory 2620. For example, the memory 2620 may include the internal logic circuit 1210 of FIG. 1.

For example, the memory 2620 may include a volatile memory such as an SRAM, a DRAM, an SDRAM, or the like, or a nonvolatile memory such as a flash memory, a PRAM, an MRAM, a ReRAM, a FRAM, or the like. Alternatively, the memory 2620 may include heterogeneous memories.

The bus 2700 may provide a communication path between the components of the electronic device 2000. For example, the main processor 2100, the memory 2200, the storage 2300, the communication device 2400, the user interface 2500, and the graphic processor 2600 may exchange data with one another through the bus 2700. The bus 2700 may be configured to support various types of communication formats used in the electronic device 2000.

According to exemplary embodiments of the inventive concept, since a frequency of a clock is adjusted according to a noise included in the clock or a frequency of a data signal, a memory system may operate normally.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory system comprising:
   a logic circuit configured to determine a first frequency of a first clock using a first signal and to generate a second signal for adjusting the first frequency of the first clock;
   a phase locked loop (PLL) circuit configured to receive a second clock, and to generate the first clock having the first frequency determined by the logic circuit, using the second clock and the second signal; and
   a signal generator configured to receive the second clock, and generate a third signal for adjusting the second frequency of the second clock using the second clock,
   wherein, when a second frequency of the second clock varies, the logic circuit determines the first frequency of the first clock such that the first frequency of the first clock generated by the PLL circuit is uniform, and operates based on the first clock having the first frequency adjusted by the second signal.

2. The memory system of claim 1, wherein the signal generator is configured to determine the second frequency of the second clock, based on a noise included in the second clock.

3. The memory system of claim 1, further comprising:
a memory cell array configured to output a data signal according to control by the logic circuit.

4. The memory system of claim 3, wherein the memory cell array is configured to store an identifier indicating information associated with a ratio between the second frequency of the second clock and a frequency of the data signal.

5. The memory system of claim 4,
wherein the signal generator is further configured to determine the frequency of the data signal,
wherein the first signal indicates information associated with the frequency of the data signal, and
wherein the logic circuit is configured to determine the first frequency of the first clock based on the frequency of the data signal.

6. The memory system of claim 5, wherein the signal generator is configured to determine the frequency of the data signal as one of frequencies determined based on the identifier.

7. The memory system of claim 5, wherein the frequency of the data signal is determined according to a request of a host, and
wherein the logic circuit is configured to determine the first frequency of the first clock to be identical to the frequency of the data signal determined by the signal generator.

8. The memory system of claim 4, wherein the logic circuit generates a fourth signal for controlling the memory cell array,
wherein the fourth signal indicates an address of a memory cell of the memory cell array where the identifier is stored, and
wherein the memory cell array is configured to output the data signal indicating the identifier in response to the fourth signal.

9. The memory system of claim 1, wherein the PLL circuit includes:
a divider configured to adjust the first frequency of the first clock according to a division ratio.

10. The memory system of claim 9, wherein the division ratio is adjusted using the second signal, and
wherein the divider is configured to output the first clock having the first frequency determined by the logic circuit, using the second clock.

11. The memory system of claim 10, further comprising:
a memory cell array configured to output a data signal under control of the logic circuit and to store an identifier indicating information about a ratio between the second frequency of the second clock and a frequency of the data signal,
wherein the division ratio corresponds to the ratio between the second frequency of the second clock and the frequency of the data signal.

12. A memory system comprising:
a logic circuit configured to determine a first frequency of a first clock using a first signal, and to generate a second signal for adjusting the first frequency of the first clock and a third signal associated with a data signal;
a phase locked loop (PLL) circuit configured to receive the second signal from the logic circuit and to generate the first clock using a second clock and the second signal; and a memory cell array configured to store an identifier, to receive the third signal from the logic circuit, to output the data signal indicating the identifier using the third signal,
wherein, when a frequency of the data signal varies, the logic circuit determines the first frequency of the first clock such that a ratio between the first frequency of the first clock and the frequency of the data signal is uniform, and
wherein the first frequency of the first clock determined by the logic circuit is one of frequencies determined based on the identifier, and
wherein the third signal indicates an address of the identifier stored in the memory cell array.

13. The memory system of claim 12, further comprising:
a signal generator configured to:
determine the first frequency of the first clock as one of the frequencies determined by the identifier using the second clock, and
generate a fourth signal for adjusting a second frequency of the second clock.

14. The memory system of claim 13, wherein, when a magnitude of noise included in the second clock is not smaller than a reference value, the signal generator is configured to adjust the second frequency of the second clock to a frequency, which is lower than the second frequency of the second clock, from among the frequencies determined by the identifier.

15. The memory system of claim 14, wherein the PLL circuit includes:
a divider configured to adjust the first frequency of the first clock according to a division ratio determined using the second signal.

16. The memory system of claim 15, wherein the divider is configured to output the first clock having the first frequency determined by the logic circuit according to the division ratio adjusted by the second signal.

17. The memory system of claim 16, wherein a number of division ratios provided by the divider is identical to a number of the frequencies determined based on the identifier.

18. A memory system comprising:
a logic circuit configured to generate a second signal for adjusting a first frequency of a first clock, using a first signal;
a PLL circuit including a divider having a first division ratio adjusted according to the second signal, wherein the PLL circuit is configured to generate the first clock having the first frequency obtained from a second clock using the first division ratio; and
a memory cell array configured to store a plurality of identifiers including a first identifier, and output a data signal indicating the first identifier,
wherein the first frequency is one of frequencies determined based on the first identifier,
wherein the divider his a plurality of division ratios including the first division ratio, and
wherein the number of the plurality of division ratios is substantially identical to the number of frequencies that may be determined based on the plurality of identifiers.

19. The memory system of claim 18, wherein the logic circuit is configured to set the first frequency of the first clock to be identical to a frequency of the data signal, using the first signal.

* * * * *